(12) United States Patent
Her et al.

(10) Patent No.: US 10,651,079 B2
(45) Date of Patent: *May 12, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Jeng Chang Her, Tainan (TW); Cha-Hsin Chao, Taipei (TW); Yi-Wei Chiu, Kaohsiung (TW); Li-Te Hsu, Tainan County (TW); Ying Ting Hsia, Kaohsiung (TW)

(73) Assignee: TAIWAN SEMICONDUCTOR MANUFACTUING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,488

(22) Filed: Dec. 17, 2018

(65) Prior Publication Data

US 2019/0139822 A1    May 9, 2019

Related U.S. Application Data

(63) Continuation of application No. 15/878,883, filed on Jan. 24, 2018, now Pat. No. 10,157,782, which is a
(Continued)

(51) Int. Cl.
*H01L 21/44*  (2006.01)
*H01L 21/768*  (2006.01)
(Continued)

(52) U.S. Cl.
CPC .... *H01L 21/76829* (2013.01); *H01L 21/0234* (2013.01); *H01L 21/02321* (2013.01);
(Continued)

(58) Field of Classification Search
CPC .......... H01L 21/76829; H01L 21/0234; H01L 21/02321; H01L 21/31155;
(Continued)

(56) References Cited

U.S. PATENT DOCUMENTS 6,146,988 A    11/2000   Ngo et al.
6,214,719 B1    4/2001   Nag
(Continued)

FOREIGN PATENT DOCUMENTS

CN           1711635 A    12/2005
CN         106486418 A     3/2017
(Continued)

OTHER PUBLICATIONS

Non-Final Office Action U.S. Appl. No. 14/840,830 dated Jun. 29, 2016.
(Continued)

*Primary Examiner* — Luan C Thai
(74) *Attorney, Agent, or Firm* — McDermott Will & Emery LLP

(57) ABSTRACT

In a method for manufacturing a semiconductor device, a first interlayer dielectric layer is formed over a substrate. First recesses are formed in the first interlayer dielectric layer. First metal wirings are formed in the first recesses. A first etch-resistance layer is formed in a surface of the first interlayer dielectric layer between the first metal wirings but not on upper surfaces of the first metal wirings. A first insulating layer is formed on the first etch-resistance layer and the upper surfaces of the first metal wirings.

20 Claims, 7 Drawing Sheets

Related U.S. Application Data continuation of application No. 15/276,051, filed on Sep. 26, 2016, now Pat. No. 9,905,456.

(51) Int. Cl.
  *H01L 21/02* (2006.01)
  *H01L 21/3115* (2006.01)
  *H01L 23/522* (2006.01)
  *H01L 23/528* (2006.01)
  *H01L 23/532* (2006.01)

(52) U.S. Cl.
  CPC .. *H01L 21/31155* (2013.01); *H01L 21/76834* (2013.01); *H01L 23/5226* (2013.01); *H01L 23/5283* (2013.01); *H01L 23/53295* (2013.01); *H01L 21/0214* (2013.01); *H01L 21/0217* (2013.01); *H01L 21/02126* (2013.01); *H01L 21/02167* (2013.01)

(58) Field of Classification Search
  CPC .......... H01L 21/76834; H01L 23/5226; H01L 23/5283; H01L 23/53295
  USPC ........................................................ 438/667
  See application file for complete search history.

(56) References Cited

U.S. PATENT DOCUMENTS

| | | | |
|---|---|---|---|
| 6,566,757 B1 | 5/2003 | Banerjee et al. | |
| 6,737,746 B2 | 5/2004 | Matsuura | |
| 6,885,105 B2 | 4/2005 | Kakamu et al. | |
| 6,917,108 B2 | 7/2005 | Fitzsimmons et al. | |
| 7,098,476 B2 * | 8/2006 | Babich | H01L 21/7681 |
| | | | 257/52 |
| 7,102,236 B2 | 9/2006 | Ohnishi et al. | |
| 7,531,891 B2 | 5/2009 | Ohto et al. | |
| 7,615,498 B2 | 11/2009 | Sasaki et al. | |
| 7,649,258 B2 | 1/2010 | Usami et al. | |
| 8,778,814 B2 | 7/2014 | Owada et al. | |
| 9,607,882 B2 | 3/2017 | Lin | |
| 9,905,456 B1 | 2/2018 | Her et al. | |
| 2003/0168747 A1 | 9/2003 | Hussein et al. | |
| 2007/0190804 A1 | 8/2007 | Beck et al. | |
| 2007/0281107 A1 | 12/2007 | Kitagawa | |
| 2008/0173976 A1 | 7/2008 | Stamper et al. | |
| 2008/0265377 A1 | 10/2008 | Clevenger et al. | |
| 2009/0166881 A1 | 7/2009 | Balakrishnan et al. | |
| 2009/0191715 A1 | 7/2009 | Hayashi | |
| 2013/0049132 A1 | 2/2013 | Doris et al. | |

FOREIGN PATENT DOCUMENTS

| | | |
|---|---|---|
| TW | 200908210 A | 2/2009 |
| TW | 200941645 A | 10/2009 |
| TW | 201347091 A | 11/2013 |
| TW | 201505125 A | 2/2015 |
| TW | 201519394 A | 5/2015 |
| TW | 201530719 A | 8/2015 |

OTHER PUBLICATIONS

Office Action Taiwanese Patent Application No. 10521032440 dated Aug. 22, 2016.
Office Action issued in corresponding Taiwanese Patent Application No. 10621284230 dated Dec. 19, 2017.
Non-Final Office Action issued in U.S. Appl. No. 15/276,051, dated Jun. 12, 2017.
Notice of Allowance issued in U.S. Appl. No. 15/276,051, dated Oct. 13, 2017.

* cited by examiner

SEMICONDUCTOR DEVICE AND MANUFACTURING METHOD THEREOF

RELATED APPLICATIONS

This application is a continuation of U.S. application Ser. No. 15/878,883 filed on Jan. 24, 2018, now U.S. Pat. No. 10,157,782, which is a continuation of U.S. application Ser. No. 15/276,051 filed on Sep. 26, 2016, now U.S. Pat. No. 9,905,456, the entire content of which applications is incorporated herein by reference.

TECHNICAL FIELD

The disclosure relates to semiconductor integrated circuits, more particularly to semiconductor devices having multiple metal wiring layers and their manufacturing processes.

BACKGROUND

As the semiconductor industry introduces new generations of integrated circuits (ICs) having higher performance and greater functionality, the density of the elements that form the ICs is increased, and metal wiring structures having multiple metal wiring layers and multiple dielectric (insulating) layers are also employed. As the density of the elements is increased and the dimensions of the elements decrease, an alignment error (an overlay error) between one metal layer and the next level metal layer would cause more problems.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1-10 are cross sectional views illustrating exemplary sequential processes for manufacturing a semiconductor device having a multiple metal wiring structure according to one embodiment of the present disclosure. FIGS. 1-10 illustrate exemplary sequential processes for fabricating two metal wiring layers (wiring levels), which are formed above a substrate. It is noted that a metal wiring layer may refer to one or more of a metal wiring laterally extending, a metal wiring with a via structure connected to an upper or lower layer and a via structure. Although there are core structures such as transistors or other elements (e.g., contacts etc.) constituting the semiconductor device (hereinafter referred to as "underlying structures") between the substrate and the metal wiring layers, detailed illustrations of such elements are omitted in FIGS. 1-10 for simplicity.

Figure 1:
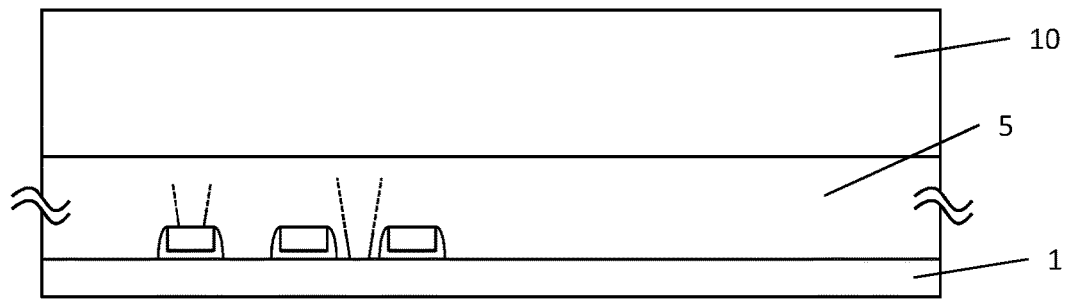
FIGS. 1-10 show exemplary sequential processes for manufacturing a semiconductor device having a multiple metal wiring structure according to one embodiment of the present disclosure.

As shown in FIG. 1, a first interlayer dielectric (ILD) layer 10 is formed over the underlying structures 5 disposed over the substrate 1. An interlayer dielectric layer may also be called an inter-metal dielectric (IMD) layer. In some embodiments, the thickness of the first ILD layer 10 is in a range from about 100 nm to about 2000 nm. The first ILD layer 10 is made of, for example, one or more layers of low-k dielectric material. Low-k dielectric materials have a k-value (dielectric constant) lower than about 3.5 and may have a k-value lower than about 2.5. In other embodiments, the first ILD layer 10 is made of silicon oxide, fluoro-silicate glass (FSG), borophospho-silicate glass (BPSG) or phospho-silicate glass (PSG).

The low-k materials for the first ILD layer 10 include elements of Si, O, C and/or H, such as SiCOH and SiOC. Organic material such as polymers may be used for the first ILD layer 10. For example, the first ILD layer 10 is made of one or more layers of a carbon-containing material, organo-silicate glass, a porogen-containing material, and/or combinations thereof. Nitrogen may also be included in the first ILD layer 10 in some embodiments. The first ILD layer 10 may be a porous layer. The density of the first ILD layer 10 is less than about 3 g/cm$^3$ in one embodiment and is less than about 2.5 g/cm$^3$ in other embodiments. The first ILD layer 10 can be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer may include an inter-layer insulating film and an inter-wire insulating film such that the metal wirings will be formed mainly in the inter-metal insulating film. The inter-layer insulating film may include a SiOC film and as the inter-wire insulating film may include a TEOS (tetraethylorthosilicate) film.

Figure 2:
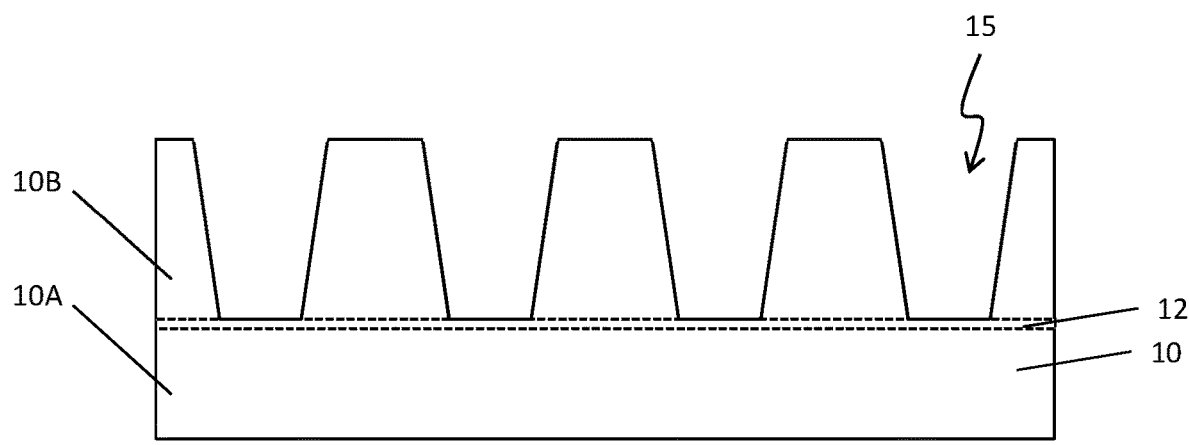

As shown in FIG. 2, first recesses 15 are formed in the first ILD layer 10 by using patterning operations including lithography and etching processes. In some embodiments, one or more via holes (contact holes) (not shown) to be connected to one or more elements of the underlying structures may be formed at the bottom of the first recesses.

In some embodiments, an etch-stop layer 12 is used so that the bottoms of the recesses 15 can be defined. In such a case, the first ILD layer 10 may include a lower first ILD layer 10A and an upper first ILD layer 10B with the etch-stop layer (ESL) 12 being interposed therebetween. The materials for the lower first ILD layer 10A and the upper first ILD layer 10B may be the same or different. If an etch-stop layer is not used, the depth of the recess can be controlled by controlling an etching time or an etching rate of the recess etching. In this disclosure, an etch-stop layer for a given etching process does not completely stop the etching process at the surface of the etch-stop layer, but may be slightly etched. However, the etch-stop layer substantially stops the etching process so that, for example, a through-hole is not formed in the etch-stop layer.

Figure 3:
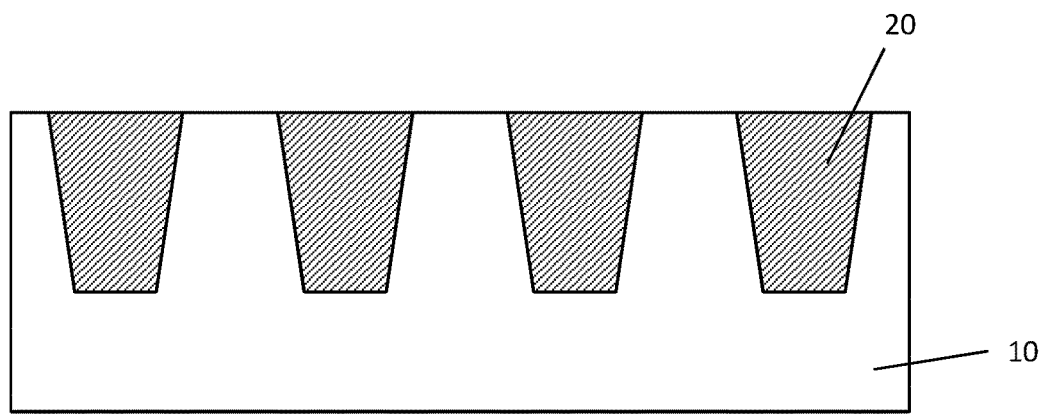

As shown in FIG. 3, a metal material is formed in the first recesses to form first metal wirings 20. The operations to form the first metal wirings include a damascene process. In the damascene process, one or more layers of metal material are formed in the first recesses 15 and on the upper surface of the first ILD layer 10, and a planarization operation, such as a chemical mechanical polishing method and/or a etch-back method, is performed to remove portions of the metal material formed on the upper surface of the first ILD layer 10.

The one or more layers of metal material are formed by CVD, physical vapor deposition (PVD) and/or electroplating.

The metal material for the first metal wirings 20 is one or more layers of Al, Cu, Co, Mn, W, Ti, Ta, TiN, TaN, TiW, WN, TiAl, TiAlN, TaC, TaCN and TiSiN. For example, the first metal wirings 20 may include a barrier layer made of, for example, TiN and/or TaN, and a body layer made of, for example, Cu or Cu-based materials.

After forming the first metal wirings 20, the upper surface of the first ILD layer 10 is modified to form an etch-resistance layer 30. The etch-resistance layer 30 can be formed by introducing one or more of Si, C, N, B, P, As and Ge atoms into the surface region of the first ILD layer 10.

In one embodiment, an ion implantation method 25 is utilized to introduce such atoms into the surface region of the first ILD layer 10. The acceleration energy of the ion implantation is in a range of about 1 keV to about 10 keV, and a dose amount is in a range from about $1 \times 10^5$ cm$^{-2}$ to about $1 \times 10^{20}$ cm$^{-2}$, in some embodiments, to provide a dopant concentration in the etch-resistance layer 30 to be in a range from about $1 \times 10^5$ cm$^{-3}$ to about $1 \times 10^{20}$ cm$^{-3}$.

The density of the etch-resistance layer 30 is higher than that of the first ILD layer 10. The density of the etch-resistance layer 30 is equal to or more than about 2.5 g/cm$^3$ in one embodiment and is more than about 3.0 g/cm$^3$ in other embodiments. In certain embodiments, the density of the etch-resistance layer 30 is equal to or more than about 3.5 g/cm$^3$.

In other embodiments, a plasma treatment is performed to introduce the atoms into the upper surface of the first ILD layer 10. For example, ammonia (NH$_3$) and/or nitrogen (N$_2$) can be used as a source gas for the plasma treatment for introducing nitrogen atoms. The plasma treatment may include direct plasma or remote plasma at a temperature of about 100° C. to about 400° C. under a pressure of less than 100 Torr. In other embodiments, one or more of BF$_3$, B$_2$H$_6$, PH$_3$, AsH$_3$, AsF$_5$, SiF$_4$, CO, CO$_2$ or GeH$_4$ are used as a source gas for the plasma treatment for introducing respective atoms.

Figure 4:
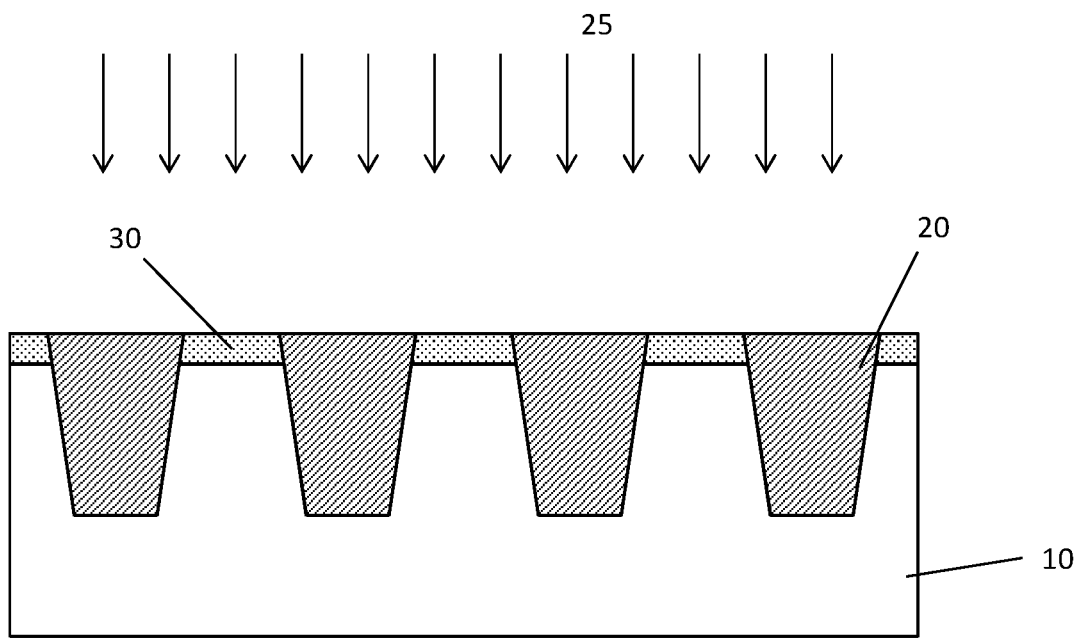

By the plasma treatment, a portion of the depth of about 5 nm to 30 nm of the upper surface of the first ILD layer 10 is modified into the etch-resistance layer 30. In some embodiments, the thickness of the etch-resistance layer is in a range from about 10 nm to about 20 nm. As shown in FIG. 4, the etch-resistance layer 30 is formed at the upper surface of the first ILD layer 10 between the first metal wirings 20, not over the first metal wirings 20.

It is noted that the elements to be introduced into the surface region of the first ILD layer 10 may be selected based on a material for a first insulating layer 40 as an etch-stop layer formed over the etch-resistance layer 30 so that a difference in an etching rate (or resistivity) between the etch-resistance layer 30 and the first insulating layer 40 is sufficiently large.

Figure 5:
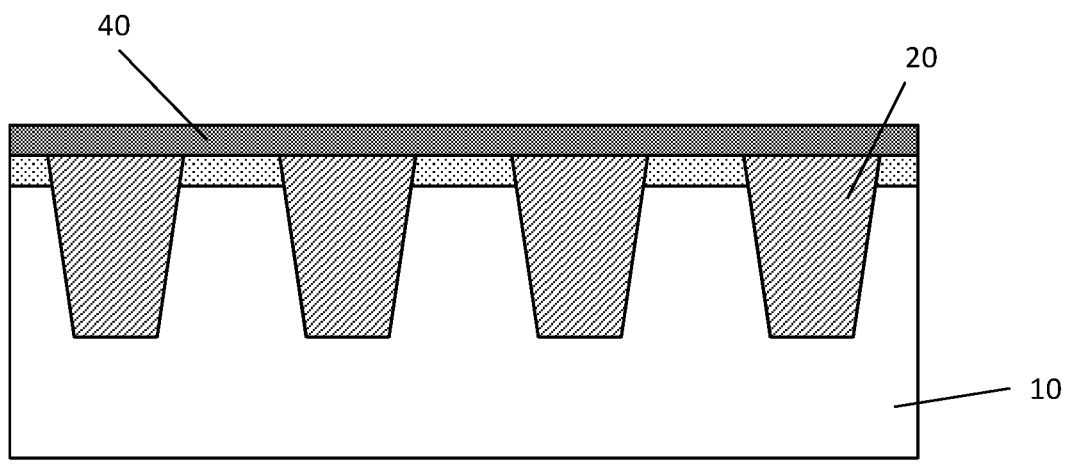

After forming the etch-resistance layer 30, a first insulating layer 40 is formed over the first metal wirings 20 and the etch-resistance layer 30, as shown in FIG. 5. The first insulating layer 40 functions as a first etch-stop layer.

The first insulating layer 40 includes one or more layers of a Si-based insulating material containing Si with O, N, C, B and or H, or an Al-based insulating material containing Al with O, N, C, B and or H. Examples of the first insulating layer include SiN, SiCN, SiC, SiCON, AlO$_x$, AlN$_x$ and AlN$_x$O$_y$. The dielectric constant of the first insulating layer is in a range of about 4 to about 10 in some embodiments.

The thickness of the first insulating layer 40 is in a range of about 1 nm to about 50 nm in some embodiments, and is in a range of about 5 nm to about 30 nm in other embodiments. The density of the first insulating layer 40 is less than about 3 g/cm$^3$ in one embodiment and is less than about 2.5 g/cm$^3$ in other embodiments.

The first insulating layer 40 can be formed by using, for example, PECVD, LPCVD, ALCVD, and/or a spin-on technology. In case of PECVD, the first insulating layer 40 is deposited at a substrate temperature in a range of about 25° C. to about 400° C. and at a pressure of less than 100 Torr.

Figure 6:
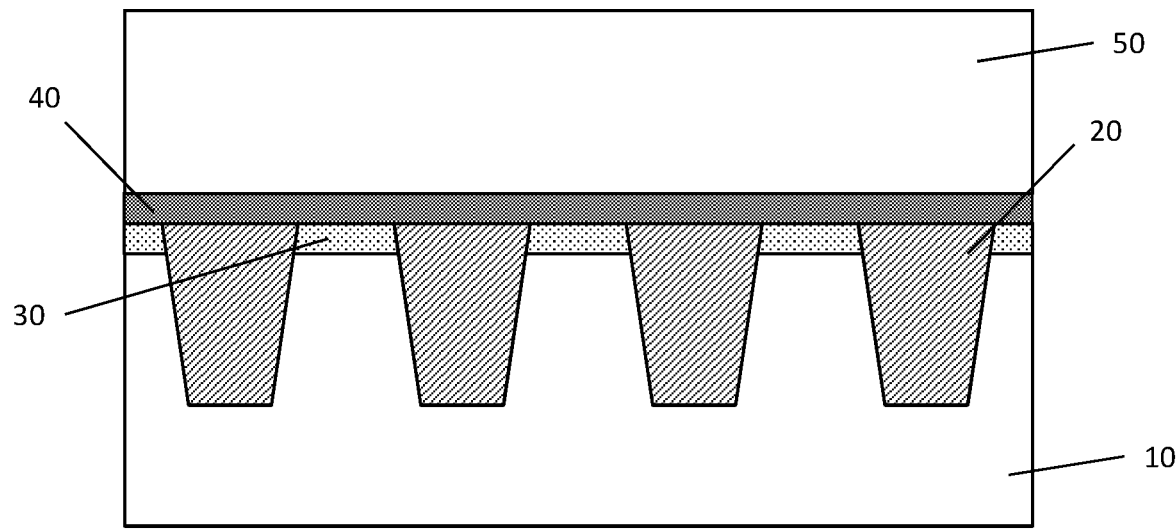

After the formation of the first insulating layer 40, a second ILD layer 50 is formed over the first insulating layer 40, as shown in FIG. 6. The second ILD layer 50 can be formed by a similar material and method to the first ILD layer 10. In some embodiments, the thickness of the second ILD layer 50 is in a range from about 100 nm to about 2000 nm.

Figure 7:
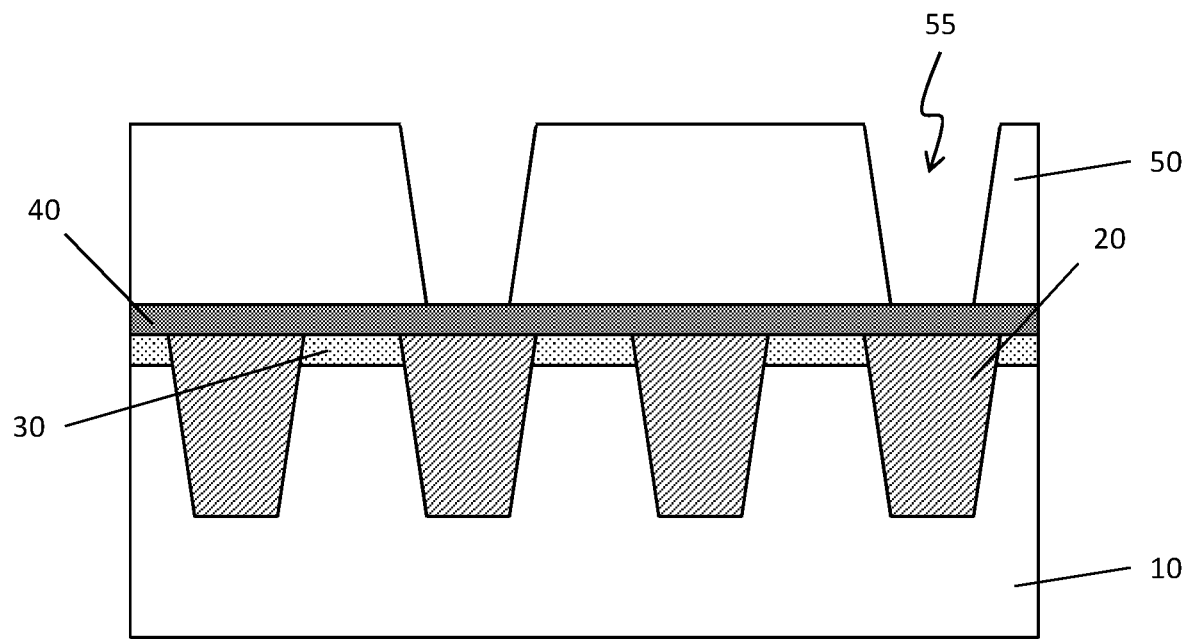

Then, as shown in FIG. 7, one or more of second recesses 55 are formed in the second ILD layer 50 by using patterning operations including lithography and etching processes. In the etching process, the etching substantially stops at the first insulating layer (etch-stop layer) 40, as shown in FIG. 7.

Figure 8A:
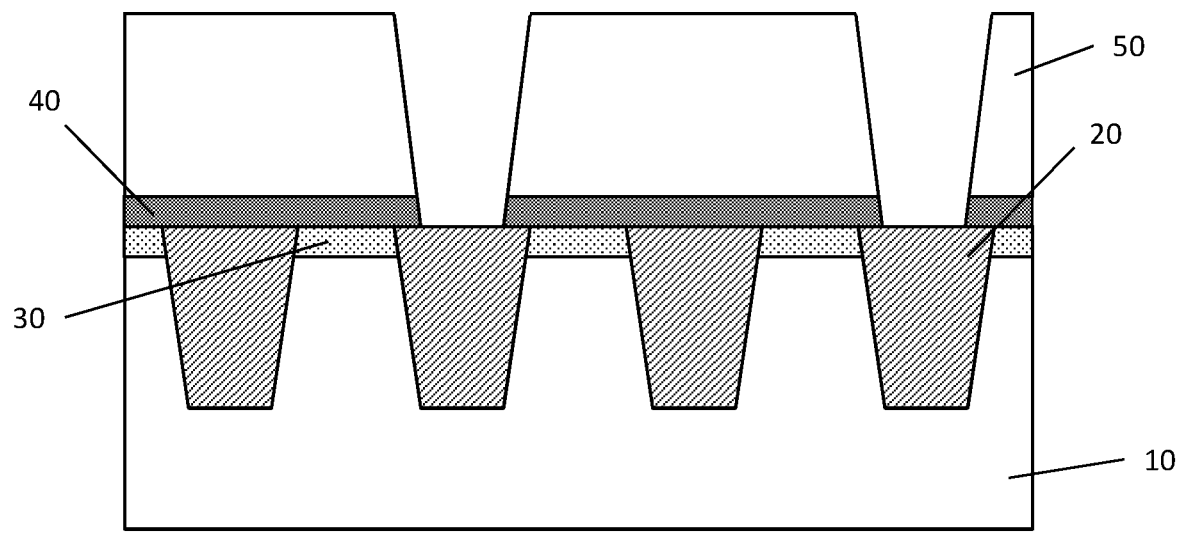

Subsequently, the first insulating layer (etch-stop layer) 40 is further etched to expose the surface of the first metal wirings 20, as shown in FIG. 8A. In FIG. 8A, the second recesses 55 are substantially aligned to the first metal wirings 20. Thus, the entire bottom of the recess is disposed on the upper surface of the first metal wiring.

Figure 8B:
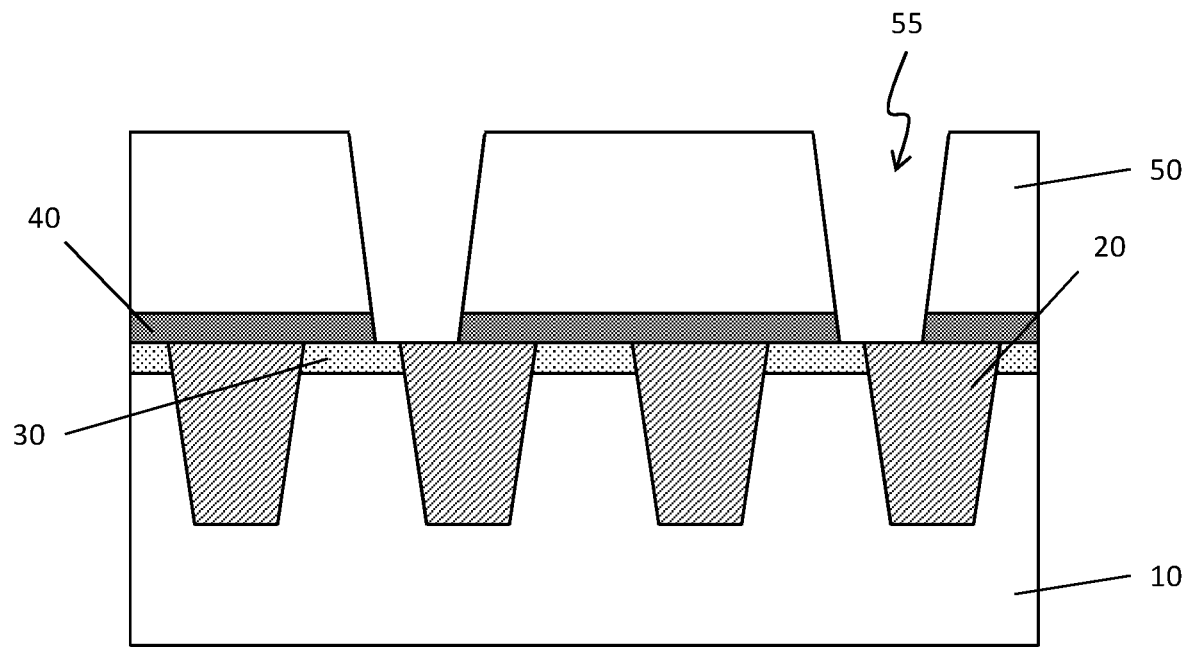

In contrast, in FIG. 8B, there is an overlay or alignment error between the second recesses and the first metal wiring 20. Accordingly, a part of the bottom of the second recess is not disposed on the upper surface of the first metal wiring, i.e., a part of the etch-resistance layer 30 is exposed in the bottom of the second recess. However, since the etch etch-resistance layer 30 is formed at the side portions of the first metal wirings, the etching substantially stops at the etch-resistance layer 30 during the etching of the first insulating layer 40.

Figure 11:
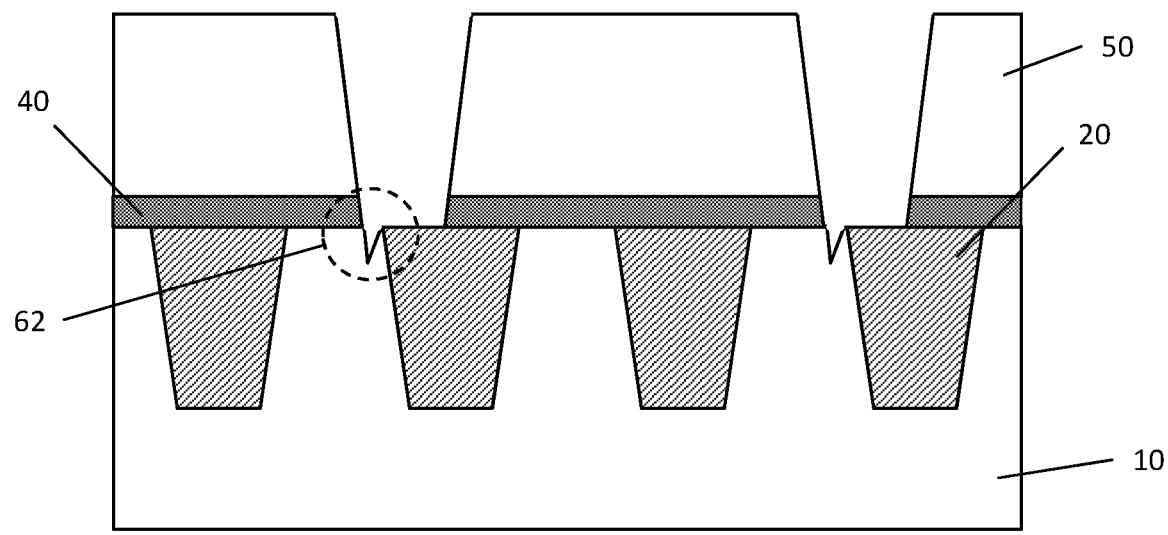
FIG. 11 shows a cross sectional view of a comparative example of a semiconductor device.

If the etch-resistance layer 30 is not formed, the first ILD layer 10 is partially etched to form a tooth-like pit 62, as shown in FIG. 11, which may cause various problems, such as low device reliability or short-circuit.

As set forth above, the etching rate in the etching of the first insulating layer 40 for the first insulating layer 40 is sufficiently higher than the etching rate for the etch-resistance layer 30. In some embodiments, the etching rate in the etching of the first insulating layer 40 for the first insulating layer 40 is about 4 times to about 20 times the etching rate for the etch-resistance layer 30.

When the first insulating layer 40 is made of SiN, the element to be implanted into the surface of the first ILD layer is one or more of Si, C, B, P, As and Ge. When the first insulating layer 40 is made of SiC, the element to be implanted into the surface of the first ILD layer is one or more of Si, N, B, P, As and Ge. When the first insulating layer 40 is made of SiCN, SiON or SiOCN, the element to be implanted into the surface of the first ILD layer is one or more of Si, B, P, As and Ge.

Figure 9:
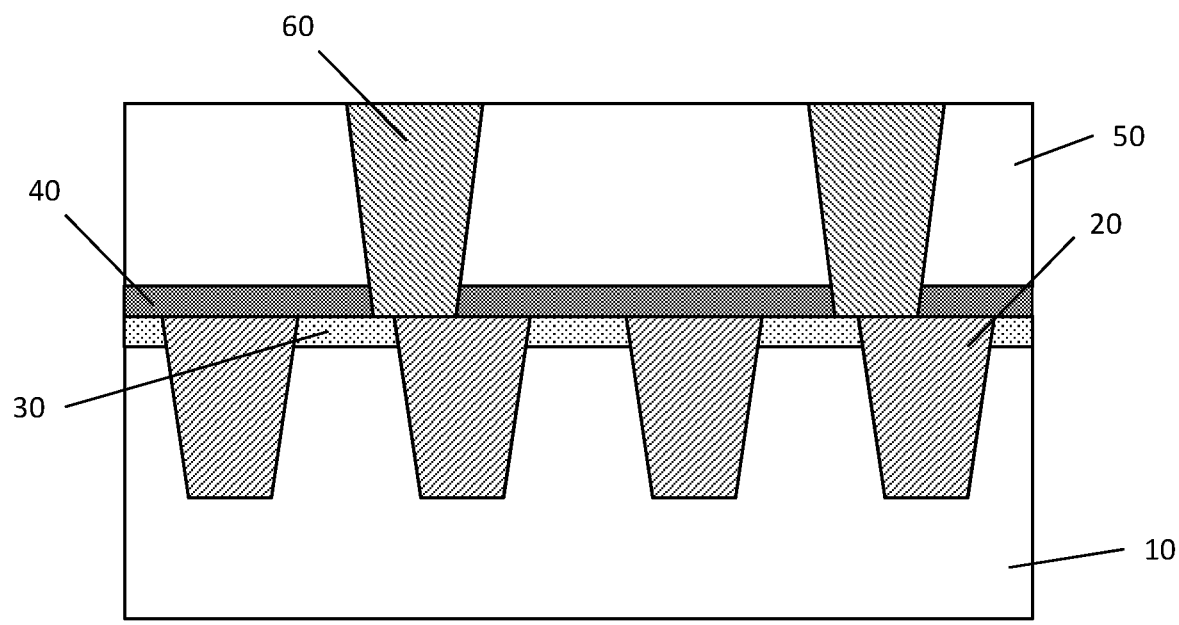

After the upper surface of the first metal wirings 20 are exposed, second metal wirings 60 are formed in the second recesses 55 by using a similar material and method as formation of the first metal wirings 20, as shown in FIG. 9.

Figure 10:
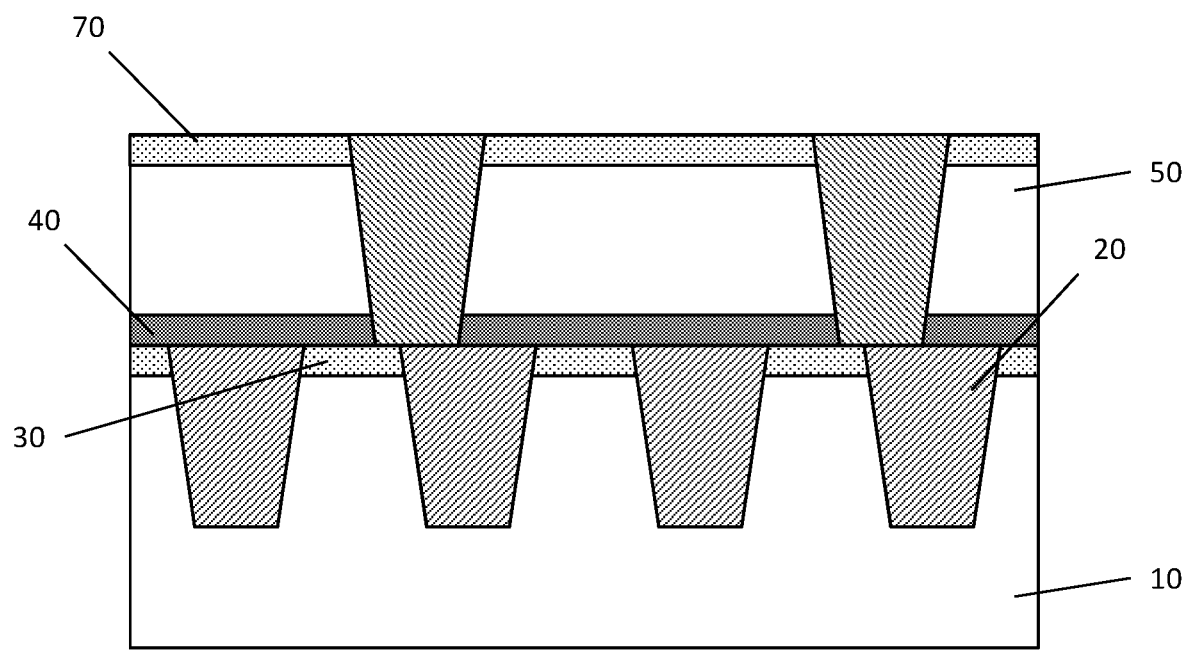

Similar to the operations explained with regard to FIG. 4, a second etch-resistance layer 70 is formed in the upper region of the second ILD layer 50 between the second metal wrings 60, as shown in FIG. 10. As shown in FIG. 10, the upper portion and the bottom of the second wirings 60 are in contact with the etch-resistance layers 30 and 70, respectively. Further, the bottoms of the second metal wirings 60 are not in contact with the first ILD layer 10 below the etch-resistance layer 30. Of course, if there is no overlay error between the second recess 55 and the first metal wiring 20 as shown in FIG. 8, the bottom of the second wirings 60 is not be in contact with the etch-resistance layer 30.

By repeating the operations explained with FIGS. 5-9, a multiple metal-layer structure can be obtained.

Figure 12:
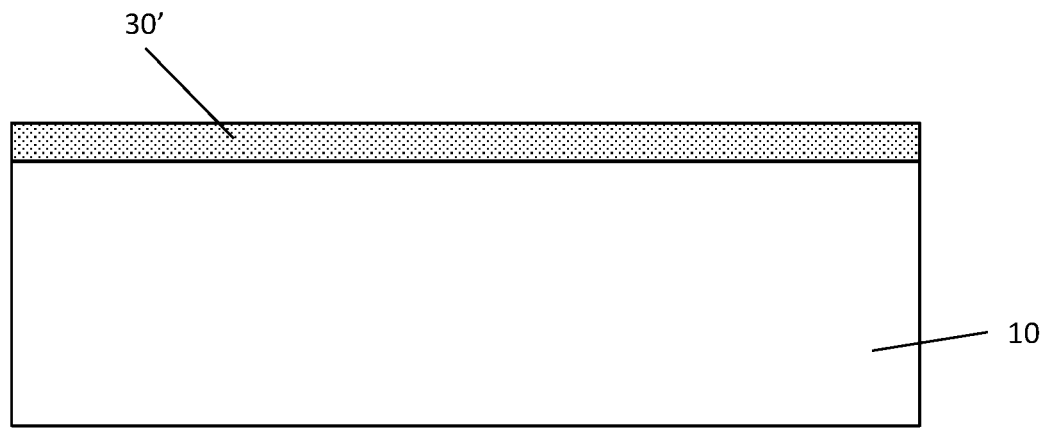
FIGS. 12-14 show exemplary sequential processes for manufacturing a semiconductor device having a multiple metal wiring structure according to another embodiment of the present disclosure.
Figure 13:
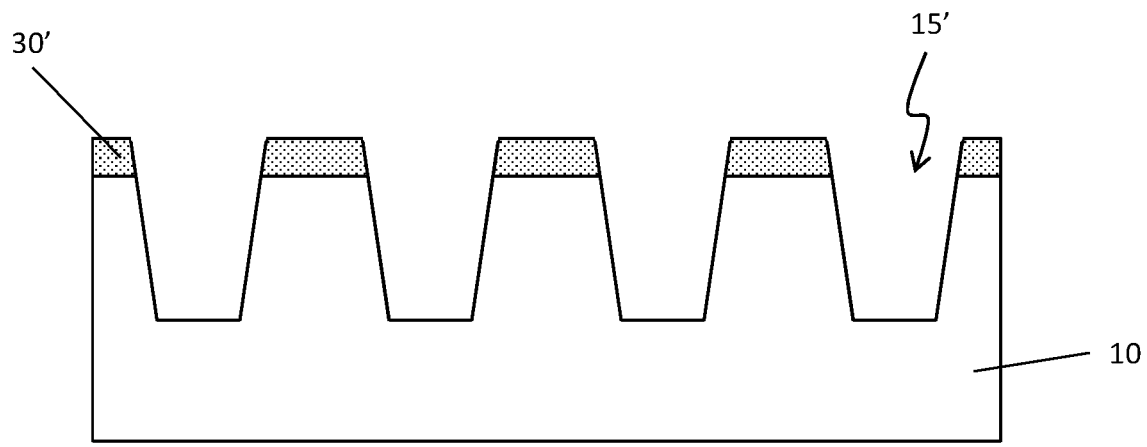
Figure 14:
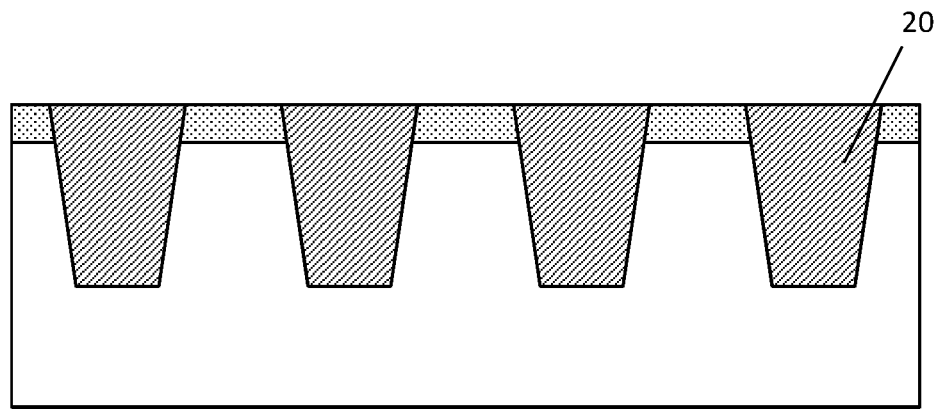

FIGS. 12-14 show exemplary sequential processes for manufacturing a semiconductor device having a multiple metal wiring structure according to another embodiment of the present disclosure. It is understood that additional operations can be provided before, during, and after processes shown by FIGS. 12-14, and some of the operations described below can be replaced or eliminated, in additional embodiments of the method. The order of the operations/processes may be interchangeable. Further, operations, processes, configurations or materials that are same as or similar to those of the aforementioned embodiment may be applied to this embodiment and the detailed explanation thereof may be omitted.

Similar to FIG. 1, a first interlayer dielectric (ILD) layer 10 is formed over the underlying structures disposed over the substrate. Then, as shown in FIG. 12, an etch-resistance layer 30' is formed over the upper surface of the first ILD layer 10.

The etch-resistance layer 30' is formed by similar materials and methods as the etch-resistance layer 30. The thickness of the etch-resistance layer 30' is in a range of about 0.5 nm to about 30 nm in some embodiments, and is in a range of about 10 nm to about 20 nm in other embodiments.

As shown in FIG. 13, first recesses 15' are formed in the first ILD layer 10 and the etch-resistance layer 30' by using patterning operations including lithography and etching processes.

Similar to FIG. 3, a metal material is formed in the first recesses to form metal wirings 20, as shown in FIG. 14. Similar to FIG. 3, the operations to form the metal wirings include a damascene process. By this operation, the structure similar to FIG. 4 can be obtained.

After the structure shown in FIG. 12 is obtained, the same or similar operations with respect to FIG. 5-9 (or 5-10) are performed to obtain the semiconductor device having a multiple metal wiring structure.

The various embodiments or examples described herein offer several advantages over the existing art. For example, in the present disclosure, since the etch etch-resistance layer is formed at the side portions of the first metal wirings, the etching substantially stops at the etch-resistance layer during the etching of the first insulating layer, which can prevent the first ILD layer from being partially etched. Thus, it is possible to improve reliability of the semiconductor devices.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first interlayer dielectric layer is formed over a substrate. First recesses are formed in the first interlayer dielectric layer. First metal wirings are formed in the first recesses. A first etch-resistance layer is formed in a surface of the first interlayer dielectric layer between the first metal wirings but not on upper surfaces of the first metal wirings. A first insulating layer is formed on the first etch-resistance layer and the upper surfaces of the first metal wirings.

In accordance with another aspect of the present disclosure, in a method for manufacturing a semiconductor device, a first interlayer dielectric layer is formed over a substrate. First recesses are formed in the first interlayer dielectric layer. First metal wirings are formed in the first recesses. A first etch-resistance layer is formed in a surface of the first interlayer dielectric layer between the first metal wirings but not on upper surfaces of the first metal wirings. A first insulating layer is formed on the first etch-resistance layer and the upper surfaces of the first metal wirings. A second interlayer dielectric layer is formed on the first insulating layer. Second recesses are formed in the second interlayer dielectric layer so that the upper surfaces of the first metal wirings are exposed. Second metal wirings are formed in the second recesses.

In accordance with another aspect of the present disclosure, a semiconductor device includes first metal wirings formed in a first interlayer dielectric layer disposed over a substrate; and an etch-resistance layer formed in a surface of the first interlayer dielectric layer between the first metal wirings but not on upper surfaces of the first metal wirings. A first insulating layer is disposed on the first etch-resistance layer and the upper surfaces of the first metal wirings, and a second interlayer dielectric layer is disposed on the first insulating layer. Second metal wiring is formed in the second interlayer dielectric layer, and connected to the first metal wirings, respectively. Bottoms of the second metal wirings are in contact with the etch-resistance layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first interlayer dielectric layer over a substrate;
    forming a first etch-resistance layer in a surface of the first interlayer dielectric layer;
    forming first recesses in the first interlayer dielectric layer and the first etch-resistance layer;
    forming first metal wirings in the first recesses; and
    forming a first insulating layer on the first etch-resistance layer and the upper surfaces of the first metal wirings,
    wherein the forming the first etch-resistance layer comprises introducing one or more selected from the group consisting of Si, C, B, P, As and Ge into the first interlayer dielectric layer.

2. The method of claim 1, wherein a thickness of the etch-resistance layer is in a range from 10 nm to 20 nm.

3. The method of claim 1, wherein a density of the first etch-resistance layer is equal to or more than 2.5 g/cm$^3$.

4. The method of claim 1, wherein the forming the first etch-resistance layer comprises introducing one or more selected from the group consisting of Si, C and Ge by an ion implantation method.

5. The method of claim 1, wherein the forming the first etch-resistance layer comprises introducing one or more selected from the group consisting of Si, C and Ge by using plasma radiation.

6. The method of claim 1, wherein the first insulating layer is made of one selected from the group consisting SiC, SiN, SiCN, SiON and SiOCN.

7. The method of claim 1, wherein one or more selected from the group consisting of Si, C, B, P, As and Ge are introduced into the first interlayer dielectric layer by an ion implantation method at acceleration energy in a range of about 1 keV to about 10 keV.

8. The method of claim 1, further comprising:
    forming a second interlayer dielectric layer on the first insulating layer;
    forming second recesses in the second interlayer dielectric layer so that the upper surfaces of the first metal wirings are exposed; and
    forming second metal wirings in the second recesses.

9. The method of claim 8, wherein:
    when the second recesses are formed, a part of the first etch-resistance layer is exposed at bottoms of the second recesses, and
    bottoms of the second metal wirings are in contact with the first etch-resistance layer.

10. The method of claim 8, further comprising:
    forming a second etch-resistance layer in a surface of the second interlayer dielectric layer between the second metal wirings but not on upper surfaces of the second metal wirings by introducing one or more selected from the group consisting of Si, N, C, B, P, As and Ge into the second interlayer dielectric layer,
    wherein upper portions the second metal wirings are in contact with the second etch-resistance layer.

11. The method of claim 10, wherein the bottoms of the second metal wirings are not in contact with the first interlayer dielectric layer below the first etch-resistance layer.

12. The method of claim 10, wherein:
    in the forming second recesses, the second interlayer dielectric layer is etched, and the etching of the second interlayer dielectric layer substantially stops at the first insulating layer,
    then, the first insulating layer is etched to expose the upper surfaces of the first metal wirings.

13. A method for manufacturing a semiconductor device, comprising:
    forming a first interlayer dielectric layer over a substrate;
    forming a first etch-resistance layer in a surface of the first interlayer dielectric layer;
    forming first recesses in the first interlayer dielectric layer and the first etch-resistance layer;
    forming first metal wirings in the first recesses; and
    forming a first insulating layer on the first etch-resistance layer and the upper surfaces of the first metal wirings,
    wherein the forming the first etch-resistance layer comprises introducing one or more of Si, C, N, B, P, As and Ge into the first interlayer dielectric layer by an ion implantation method, or introducing one or more of Si, C, B, P, As and Ge into the first interlayer dielectric layer by using plasma radiation.

14. The method of claim 13, wherein a thickness of the etch-resistance layer is in a range from 10 nm to 20 nm.

15. The method of claim 13, wherein a density of the first etch-resistance layer is equal to or more than 2.5 g/cm$^3$.

16. The method of claim 13, wherein the forming the first etch-resistance layer comprises introducing one or more of Si, C, B, P, As and Ge into the first interlayer dielectric layer by an ion implantation method.

17. The method of claim 13, wherein:
    the first insulating layer is made of SiN.

18. The method of claim 13, wherein:
    the first insulating layer is made of SiC, and
    one or more of Si, B, P, As and Ge are implanted into the first interlayer dielectric layer.

19. The method of claim 13, wherein:
    the first insulating layer is made of SiCN, SiON or SiOCN, and
    one or more of Si, B, P, As and Ge are implanted into the first interlayer dielectric layer.

20. A method for manufacturing a semiconductor device, comprising:
    forming a first interlayer dielectric layer over a substrate;
    forming a first etch-resistance layer in a surface of the first interlayer dielectric layer;
    forming first recesses in the first interlayer dielectric layer and the first etch-resistance layer;
    forming first metal wirings in the first recesses;
    forming a first insulating layer on the first etch-resistance layer and the upper surfaces of the first metal wirings;
    forming a second interlayer dielectric layer on the first insulating layer;
    forming second recesses in the second interlayer dielectric layer so that the upper surfaces of the first metal wirings are exposed; and
    forming second metal wirings in the second recesses,
    wherein the forming the first etch-resistance layer comprises introducing one or more of Si, C, N, B, P, As and Ge into the first interlayer dielectric layer by an ion implantation method, or introducing one or more of Si, C, B, P, As and Ge into the first interlayer dielectric layer by using plasma radiation.

* * * * *